(12) United States Patent
Koyama

(10) Patent No.: US 7,573,019 B2
(45) Date of Patent: Aug. 11, 2009

(54) LIGHT DETECTING APPARATUS, ILLUMINATION OPTICAL APPARATUS, EXPOSURE APPARATUS AND EXPOSURE METHOD

(75) Inventor: Motoo Koyama, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/628,052

(22) PCT Filed: Jun. 6, 2005

(86) PCT No.: PCT/JP2005/010356

§ 371 (c)(1),
(2), (4) Date: Nov. 1, 2007

(87) PCT Pub. No.: WO2005/124831

PCT Pub. Date: Dec. 29, 2005

(65) Prior Publication Data

US 2008/0042044 A1    Feb. 21, 2008

(30) Foreign Application Priority Data

Jun. 18, 2004    (JP) ............................ 2004-180816

(51) Int. Cl.
*G02B 5/30* (2006.01)
(52) U.S. Cl. .................. 250/227.11; 359/566; 359/569; 359/571
(58) Field of Classification Search .................. 250/216, 250/205, 227.11; 359/566, 569, 571
See application file for complete search history.

(56) References Cited

U.S. PATENT DOCUMENTS 4,180,702 A * 12/1979 Sick et al. ............... 250/227.11

| 5,568,304 | A | * | 10/1996 | Baur | ........................ 398/202 |
|---|---|---|---|---|---|
| 6,028,660 | A | | 2/2000 | Van Der Laan et al. | |
| 6,337,734 | B1 | | 1/2002 | Mori | |
| 6,728,034 | B1 | * | 4/2004 | Nakanishi et al. | ........... 359/566 |
| 7,045,796 | B2 | * | 5/2006 | Karasawa | ............... 250/208.1 |
| 2004/0233534 | A1 | | 11/2004 | Nakanishi et al. | |

FOREIGN PATENT DOCUMENTS

| JP | A-56-027117 | 3/1981 |
|---|---|---|
| JP | A-57-027227 | 2/1982 |
| JP | A 08-203803 | 8/1996 |
| JP | A 2000-294480 | 10/2000 |
| JP | A 2001-059905 | 3/2001 |
| WO | WO 97/31298 | 8/1997 |

* cited by examiner

*Primary Examiner*—Georgia Y Epps
*Assistant Examiner*—Tony Ko
(74) *Attorney, Agent, or Firm*—Oliff & Berridge, PLC

(57) ABSTRACT

A light detecting apparatus which can be arranged even in an optical path of which converting angle is relatively large, and can accurately detect light entering along a predetermined direction in an optical path. The light detecting apparatus (10) for detecting light which enters in a predetermined direction in an optical path has a light splitting element (11) having two optical surfaces (11a, 11b) positioned in the optical path, and a photoelectric detector (12) for photo detecting light which propagates inside the light splitting element and which is guided from a side face (11c) of the light splitting element. The light splitting element further has an incident angle conversion section (13) for converting a part of light which enters one optical face of the light splitting element into light entering the other optical surface at an incident angle greater than or equal to a total reflection angle.

51 Claims, 16 Drawing Sheets (a)  (b)

Fig.3
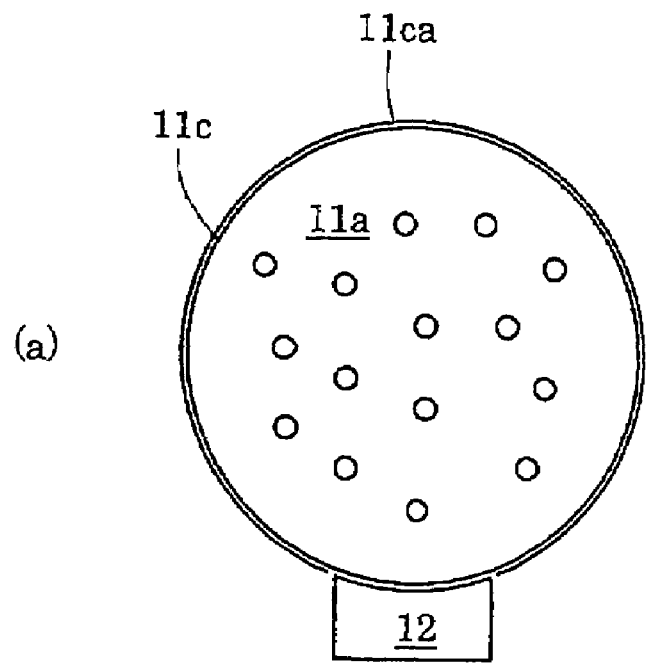
(a)
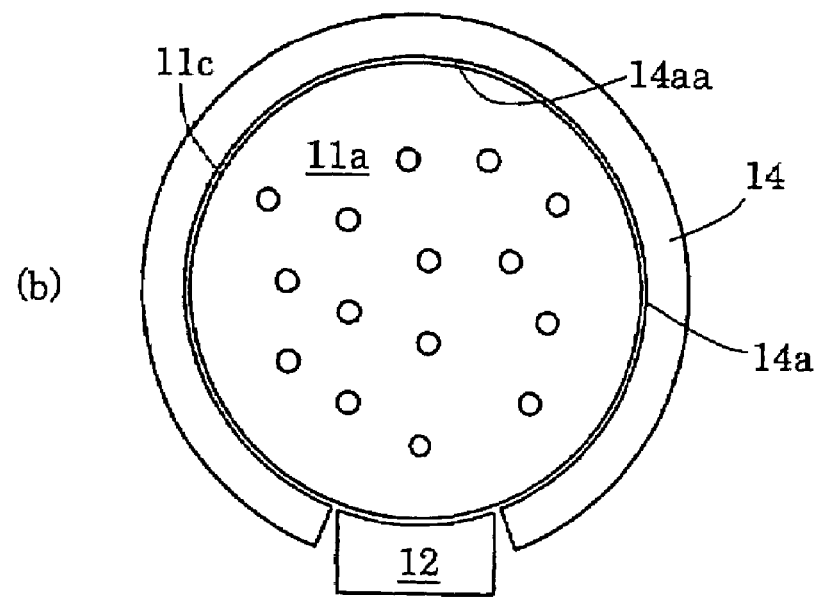
(b)

LIGHT DETECTING APPARATUS, ILLUMINATION OPTICAL APPARATUS, EXPOSURE APPARATUS AND EXPOSURE METHOD

TECHNICAL FIELD

The present invention relates to a light detecting apparatus, illumination optical apparatus, exposure apparatus, and exposure method, and more particularly to a light detecting apparatus suitably used for control of exposure light quantity (exposure dose) in an exposure apparatus which is used for manufacturing such micro devices as a semiconductor device, image sensing device, liquid crystal display device and thin film magnetic head, in a lithography process.

BACKGROUND ART

In this type of typical exposure apparatus, light beam emitting from a light source forms a secondary light source as a substantive surface illuminant comprised of many light sources via a fly's eye lens (or micro lens array) as an optical integrator. The light beam from the secondary light source is converged by a condenser lens, then is superimposed and illuminates a mask where a predetermined pattern is formed. The light transmitted through the pattern of the mask form images on a photosensitive substrate via a projection optical system. In this way, the mask pattern is projected and exposed (transferred) on the photosensitive substrate.

In the exposure apparatus, a light detecting apparatus for detecting the exposure light quantity (exposure dose) for the photosensitive substrate is provided. This light detecting apparatus for an exposure monitor extracts a part of the illumination light (exposure light) from the optical path, and detects the intensity of the extracted light (e.g. patent document 1). By adjusting the emission output of the light source according to the change of the light intensity detected by the light detecting apparatus, the exposure light quantity for the photosensitive substrate is controlled so as to be substantially constant during exposure.

Patent Document 1: Japanese Patent Application Laid-Open No. H8-203803

DISCLOSURE OF THE INVENTION

Problems to be Solved by the Invention

Specifically, the photo detector for an exposure monitor according to a typical prior art is comprised, as shown in FIG. 15, of a plane parallel plate type beam splitter 102 which is inclined and placed in the optical path between a condenser lens 100 for converging light beam from a secondary light source formed via a fly's eye lens (not illustrated), for example, and a mask 101, and a light receiving sensor 103 for photo-detecting the light reflected by the beam splitter 102.

With this conventional photo detector, however, if a converging angle (opening angle) θ of light beam, which enters the mask 101, increases, as shown in FIG. 16, it is difficult to position the beam splitter 102 in the optical path while avoiding mechanical interference with other optical elements, including the mask 101. Also even if the beam splitter 102 could be positioned in the optical path, it is difficult to position the light quantity sensor 103 in the optical path without blocking a part of the light beam.

It is an object of the present invention to provide a light detecting apparatus which can be positioned while avoiding a mechanical interference with other optical elements even in an optical path of which converging angle is relatively large, and can accurately detect light which enter in a predetermined direction in the optical path.

It is another object of the present invention to provide an exposure apparatus and an exposure method for accurately controlling the exposure light quantity for a photosensitive substrate to be substantially constant during exposure, using a high precision light detecting apparatus which can be positioned even in an optical path of which converging angle is relatively large.

Means for Solving the Problems

To achieve the above objects, a first aspect of the present invention provides a light detecting apparatus for detecting light which enters along a predetermined direction in an optical path, comprising a light splitting element having two optical surfaces positioned in the optical path, and a photoelectric detector for photo-detecting light which propagates inside the light splitting element and is guided out of a side face of the light splitting element, wherein the light splitting element further has an incident angle conversion section for converting a part of light which enters one optical surface out of the two optical surfaces into light entering the other optical surface at an incident angle greater than or equal to a total reflection angle.

A second embodiment of the present invention provides a light detecting apparatus for detecting light which enters along a predetermined direction in an optical path, comprising: a light splitting element having two optical surfaces, positioned in the optical path and a side face; a photoelectric detector positioned so as to face the side face of the light splitting element; and an incident angle conversion section provided on the light splitting element or inside the light splitting element for converting a part of light which enters one optical surface out of the two optical surfaces into light entering the other optical surface at an incident angle greater than or equal to a predetermined reflection angle.

A third embodiment of the present invention provides an illumination optical apparatus for illuminating an illumination target surface with light beam from a light source, comprising the light detecting apparatus according to the first aspect or second aspect positioned so as to detect light which enters along a direction from the light source to the illumination target surface.

A fourth embodiment of the present invention provides an illumination optical apparatus for illuminating an illumination target surface with light beam from a light source, comprising the light detecting apparatus according to the first aspect or second aspect positioned so as to detect light which enters along a direction from the illumination target surface to the light source.

A fifth embodiment of the present invention provides an exposure apparatus, comprising the illumination optical apparatus according to the third aspect or fourth aspect for illuminating a predetermined pattern, wherein the predetermined pattern is exposed on a photosensitive substrate.

A sixth embodiment of the present invention provides an exposure apparatus for exposing a predetermined pattern on a photosensitive substrate via a projection optical system, comprising the light detecting apparatus according to the first aspect or second aspect, wherein the light detecting apparatus is positioned between the predetermined pattern and the photosensitive substrate.

A seventh embodiment of the present invention provides an exposure method wherein a predetermined pattern is illuminated using the illumination optical apparatus according to the third aspect or fourth aspect, and the predetermined pattern is exposed on a photosensitive substrate.

An eighth embodiment of the present invention provides a light splitting element positioned in an optical path for guiding a part of entered light into outside the optical path, wherein the light splitting element has two optical surfaces positioned in the optical path, and has an incident angle conversion section for converting a part of light which enters one optical surface out of the two optical surfaces into light entering the other optical surface at an incident angle greater than or equal to a critical angle.

A ninth embodiment of the present invention provides a light splitting element positioned in an optical path for guiding a part of entered light into outside the optical path, wherein the light splitting element has two optical surfaces positioned in the optical path and a side face, and has an incident angle conversion section provided on the light splitting element or in the light splitting element for converting a part of light which enters one optical surface out of the two optical surfaces into light entering the other optical surface at an incident angle greater than or equal to a predetermined reflection angle.

A tenth embodiment of the present invention provides a light detecting apparatus for detecting light entering in a predetermined direction in an optical path, comprising the light splitting element according to the ninth aspect, and a photoelectric detector positioned to face the side face of the light splitting element for photo-detecting light guided from the light splitting element.

Merit of the Invention

The light detecting apparatus of the present invention photo-detects light which propagates inside the light splitting element positioned in the optical path without substantially being inclined with respect to the optical axis, and is guided from the side face of the light splitting element. As a result, the light detecting apparatus of the present invention can be positioned even in an optical path of which converging angle is relatively large without mechanical interference with other optical elements, unlike the prior art, in which a plane parallel plate type beam splitter is inclined and positioned in the optical path at a 45° angle from the optical axis, and can accurately detect light which enters into the optical path along a predetermined direction.

Therefore according to the exposure apparatus and exposure method of the present invention, the exposure light quantity for the photosensitive substrate can be accurately controlled so as to be substantially constant during exposure, using a high precision light detecting apparatus which can be positioned even in an optical path of which converging angle is relatively large. As a result, according to the exposure apparatus and exposure method of the present invention, good exposure can be performed by accurately controlling exposure light quantity, and therefore good apparatus can be manufactured.

BRIEF DESCRIPTION OF THE DRAWINGS

FIG. 3 are diagrams depicting light reflection processing in the light detecting apparatus according to the present embodiment;

BEST MODE FOR CARRYING OUT THE INVENTION

Figure 1:
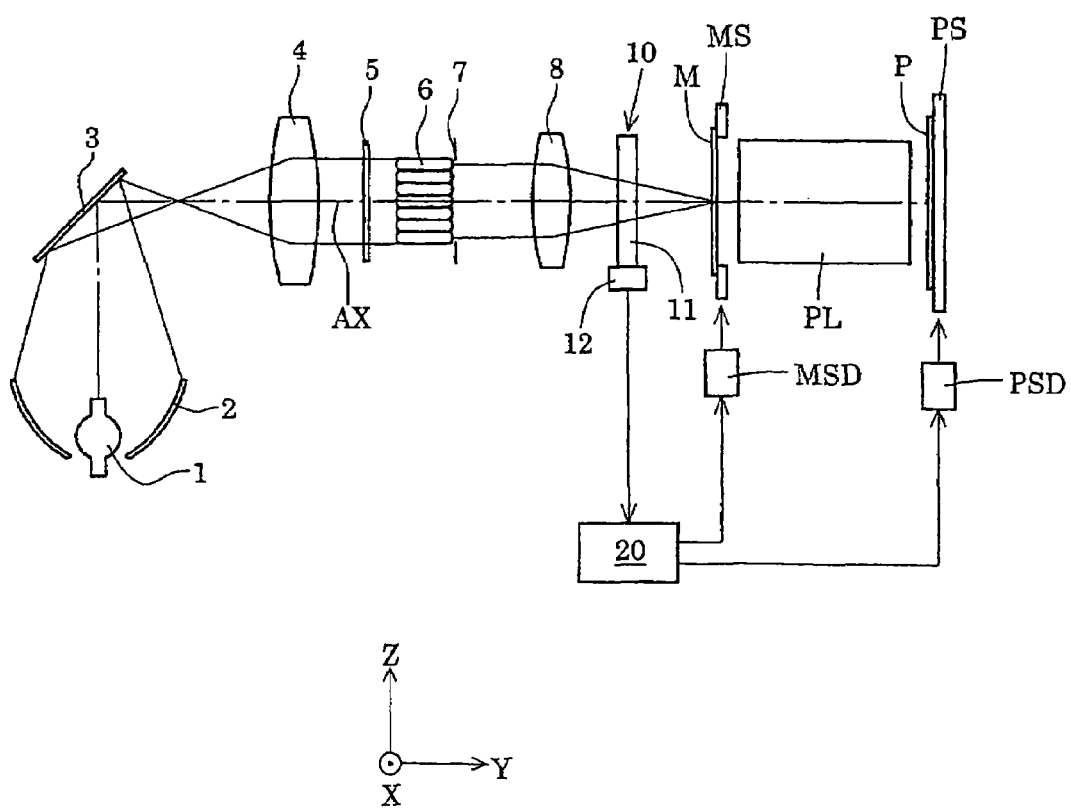
FIG. 1 is a schematic diagram depicting the configuration of the exposure apparatus according to an embodiment of the present invention.

Embodiments of the present invention will now be described with reference to the accompanying drawings. FIG. 1 is a schematic diagram depicting a configuration of an exposure apparatus according to an embodiment of the present invention. In FIG. 1, the Y axis is set along the normal line of a plate P (glass substrate on which resist is coated), which is a photosensitive substrate, the Z axis is set in a direction parallel with the page face in FIG. 1 in the plane of the plate P, and the X axis is set in a direction perpendicular to the page face in FIG. 1 in the plane of the plate P.

The exposure apparatus in FIG. 1 has a light source 1, which is a high pressure mercury lamp, for example. The light source 1 is positioned at a first focal position of an elliptical mirror 2 having a reflection surface, which is a rotating elliptical surface. Therefore light beam emitted from the light source 1 is reflected by the reflection plane of the elliptical mirror 2, and forms a light source image at the second focal position of the elliptical mirror 2 via a reflection mirror 3. The light beam from the light source image formed at the second focal position of the elliptical mirror 2 is converted into a light beam having substantially parallel light by a collimator lens 4, then enters a wavelength selection filter 5 for selectively transmitting light beam having a desired wavelength range.

The wavelength selection filter 5 selectively transmits light of the g line (λ=436 nm), light of the h line (λ=405 nm) and the light of the i line (λ=365 nm), for example. The light, with selected exposure wavelength λ via the wavelength selection filter 5, enters a fly's eye lens 6 as an optical integrator. The wavelength selection filter 5 can simultaneously select the light of the g line and light of the h line, for example, or can simultaneously select the light of the h line and light of the i line, or can select only the light of the i line.

The fly's eye lens 6 is comprised of many lens elements having positive refracting power which are densely arrayed so that the optical axes thereof become parallel with the reference optical axis AX. Each lens element constituting the fly's eye lens 6 has a rectangular cross section, which is similar to the form of the illuminated field to be formed on the mask (that is, a form of the exposure area to be formed on the plate). Therefore the light beam which enters the fly's eye lens 6 is wave-front separated by the many lens elements, and one light source image is formed on the rear side focal plane of each lens element respectively. In other words, on the rear side focal plane of the fly's eye lens 6, a substantial surface illuminant, that is a secondary light source, comprised of many light source images, is formed.

The light beam from the secondary light source formed on the rear side focal plane of the fly's eye lens 6 enters an aperture stop 7 placed near there. The aperture stop 7 is positioned at an optically conjugate position with an entrance pupil plane of the later mentioned projection optical system PL and has a variable aperture section for specifying a range to contribute to the illumination of the secondary light source. By changing the aperture diameter of the variable aperture section, the aperture stop 7 sets an σ value for deciding the illumination conditions (ratio of aperture of the secondary light source image on the pupil plane with respect to the aperture diameter of the pupil plane of the projection optical system) to a desired value.

The light from the secondary light source via the aperture stop 7 receives the converging function of a condenser optical system 8, then superimposes and illuminates a mask M, on which a predetermined pattern is formed, via a light splitting element 11 constituting a part of a light detecting device 10 as an exposure monitor. The light guided from the side face of the light splitting element 11 is photo-detected by a photoelectric detector 12, and the output of the photoelectric detector 12 is supplied to a control section 20. The configuration and function of the light detecting device 10 (11, 12) will be described later.

In this way, a rectangular illumination area, which is similar to the cross-sectional form of each lens element of the fly's eye lens 6 and extends lengthwise in the X direction, is formed on the mask M. A mask blind, as a field stop for specifying a shape of the illumination area formed on the mask M, and a blind image formation optical system, may be placed in an optical path between the condenser optical system 8 and the mask M.

The mask M is held on a mask stage MS via a mask holder (not illustrated) in parallel with the XZ plane (that is a horizontal plane). The mask stage MS can move two-dimensionally along the mask face (that is on the XZ plane) by a function of the mask stage driving system MSD, and the position coordinates thereof are measured and position-controlled by a mask interferometer (not illustrated).

The light beam, which transmitted the pattern of the mask M, forms a rectangular mask pattern image, which extends lengthwise in the X direction on the plate P, which is a photosensitive substrate, via the projection optical system PL. The plate P is held on the plate stage PS in parallel with the XZ plane via a plate holder (not illustrated). The plate stage PS can move two-dimensionally along the plate surface (that is XZ plane) by a function of the plate stage drive system PSD, and the position coordinates thereof are measured and position-controlled by a plate interferometer (not illustrated).

By performing projection exposure while moving the mask M and the plate P in the Z direction with respect to the projection optical system PL, the pattern of the mask M is scanned and exposed on the exposure area of the plate P. In other words, on the exposure area of the plate P, the rectangular pattern, specified by the dimension of the rectangular mask pattern image in the X direction which is formed in a still state and the dimension corresponding to the moving distance of the plate P along the Z direction during a scan exposure, is formed.

Figure 2:
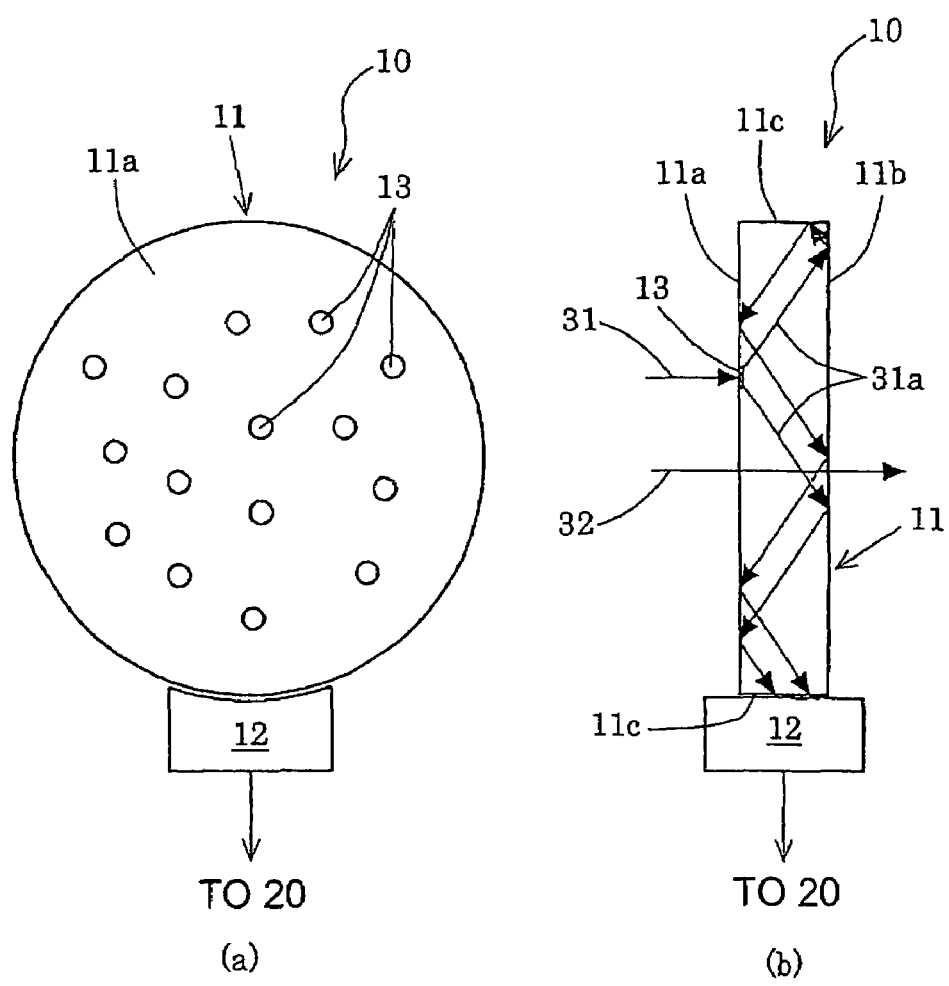
FIG. 2 are schematic diagrams depicting a configuration of the light detecting apparatus according to the present embodiment.

FIG. 2 are schematic diagrams depicting the configuration of the light detecting apparatus according to the present embodiment. In FIG. 2, the light detecting device 10 of the present embodiment is comprised of the light splitting element 11 which is positioned in the optical path between the condenser optical system 8 and the mask M and has a form of a plane parallel plate, and the photoelectric detector 12 for photo-detecting light guided from the side face of this light splitting element 11. In this case, a silicon photodiode, for example, can be used as the photoelectric detector 12.

On an optical surface 11a at the light source side (light entering side) of the light splitting element 11, a plurality of transmission type micro diffusion surface areas 13 are dispersed and positioned. In the cross-sectional view in FIG. 2B, however, only one diffusion area 13 is shown to simplify the drawing. The light 31 which enters the diffusion surface area 13 of the light splitting element 11 are subject to the diffusion function, and are guided to various directions, and a part of the light 31a enter the optical surface 11b at the mask side (light emitting side) at an incident angle which is greater than or equal to a total reflection angle (critical angle).

The light 31a, which enters the optical surface 11b at an incident angle greater than or equal to the total reflection angle via the diffusion surface area 13, substantially propagates inside the light splitting element 11 without optical loss while repeating reflection on the optical surface 11b at the light emitting side, the side face 11c of the light splitting element 11 and the optical surface 11a at the light entering side, is guided from a specific area (light transmission area) of the side face 11c of the light splitting element 11, and reaches the photoelectric detector 12. The light 32 which enters the areas other than the diffusion surface area 13 of the light splitting element 11 transmits through the light splitting element 11, and reaches the mask M as the exposure light. The output (detection signal) of the photoelectric detector 12 is supplied to the control section 20.

In this way, the control section 20 detects the intensity of light which enters the light splitting element 11, in the optical path between the condenser optical system 8 and the mask M in the direction from the light source 1 to the mask M and the intensity of light which enters the plate P based on the output of the photoelectric detector 12. The control section 20 adjusts the moving speed of the mask stage MS and the plate stage PS, for example, based on the light intensity information detected in the light detecting device 10, so that the exposure light quantity for the plate P, which is a photosensitive substrate, becomes substantially constant. In the case of a scan type exposure apparatus, like this embodiment, the control section 20 may adjust the emission output of the light source 1 and the degree of decreasing light of a light decreasing element positioned between the light source 1 and the mask M based on the light intensity information detected by the light detecting device 10. In the case of a batch exposure type exposure apparatus which performs exposure in a state where the mask M and the plate P are relatively standing still, the control section 20 controls the ON/OFF timer of the shutter provided near the second focal position of the elliptical mirror 2 based on the light intensity information detected by the light detecting device 10. In other words, the control section 20 controls so that the shutter is left open until the integrated value of the light intensity, detected by the light detecting device 10, becomes a predetermined value, and closes the shutter when this integrated value of the light intensity becomes a predetermined value.

As described above, the light detecting device 10 according to the present embodiment, photo-detects the light, which propagated inside the light splitting element 11 having a form of a plane parallel plate which is positioned in the optical path without inclining from the optical axis and is guided from the side face of the light splitting element 11. As a result, the light detecting device 10 of the present embodiment can be positioned even in an optical path, of which converging angle, between the condenser optical system 8 and the mask M in the exposure apparatus is relatively large while avoiding mechanical interference with other optical elements (e.g. condenser optical system 8, mask M) and light which enters the optical path in a predetermined direction (direction from the light source 1 to the mask M) can be accurately detected, unlike the prior art in which the plane parallel plate type beam splitter is inclined and positioned in the optical path at a 45° angle from the optical axis, for example.

Therefore according to the exposure apparatus of the present embodiment, the moving speed of the mask stage MS and plate stage PS and emission output of the light source 1, for example, are adjusted based on the light intensity information detected by a high precision light detecting device 10 which can be positioned even in an optical path of which converging angle is relatively large, so the exposure light quantity for the plate P, which is a photosensitive substrate, can be accurately controlled so as to be substantially constant during exposure.

In the above mentioned embodiment, the light which propagated inside the light splitting element 11 and transmitted through the side face 11c is guided to outside the light splitting element 11, and does not reach the photoelectric detector 12. As a result, not only does the light efficiency of the light detecting device 10 drop, but it also becomes difficult to constantly detect light intensity in proportion to the intensity of the light which enters the light splitting element 11 by the photoelectric detector 12, and the detection accuracy of the light detecting device 10 may drop.

Therefore in the present embodiment, it is preferable that light reflection treatment is performed on an area of the side face 11c excluding a transmission area of the light guided from the light splitting element 11 to the photoelectric detector 12. Specifically, as the light reflection treatment on the side face 11c of the light splitting element 11, this area of the side face 11c is formed to be substantially smooth. Or, a reflection film 11ca may be formed on this area of the side face 11c of the light splitting element 11 by deposition of an appropriate metal film, for example, as shown in FIG. 3A, after forming the side face 11c of the light splitting element 11 to be substantially smooth, or without forming the side face 11c of the light splitting element 11 to be so smooth.

Also a contact element 14, having a contact face 14a which substantially contacts this area of the side face 11c excluding the transmission area of light which is guided from the light splitting element 11 to the photoelectric detector 12, may be attached, as shown in FIG. 3B, in addition to the light reflection treatment on the side face 11c of the light splitting element 11, or without performing the light reflection treatment on the side face 11c of the light splitting element 11. In this case, it is preferable that light reflection treatment has been performed on the contact face 14a of the contact element 14.

As the light reflection treatment on the contact face 14a of the contact element 14, a light reflection treatment similar to the side face 11c of the light splitting element 11 can be performed. In other words, as the light reflection treatment on the contact face 14a of the contact element 14, the contact face 14a may be formed to be substantially smooth, or a reflection film 14aa, such as an appropriate metal film, may be formed on the contact face 14a.

By performing light reflection treatment on the side face 11c of the light splitting element 11, attaching a contact element 14 which substantially contacts the side face 11c of the light splitting element 11, or performing light reflection treatment on the contact face 14a of the contact element 14, light which propagates inside the light splitting element 11 and enters the side face 11c are reflected without fail, and are finally guided to the photoelectric detector 12. As a result, light intensity in proportion to the intensity of the incident light can be detected, like an integrating sphere, and detection accuracy of the light detecting device 10 can be increased since information is consistent. The above mentioned aspects on the light reflection treatment are the same for each modification, which will be described later.

According to the above embodiment, as an incident angle conversion section for converting a part of light which enters the optical face 11a at the light entering side of the light splitting element 11 into light which enters the optical surface 11b at the light emitting side at an incident angle greater than or equal to the total reflection angle, a plurality of (at least one theoretically) transmission type micro diffusion surface areas 13 formed on the optical surface 11a at the light entering side are used. However, the present invention is not limited to this, and a plurality of (at least one theoretically) reflection type micro diffusion surface areas 13a may be formed on the optical surface 11b at the light emitting side as the incident angle conversion section.

Figure 4:
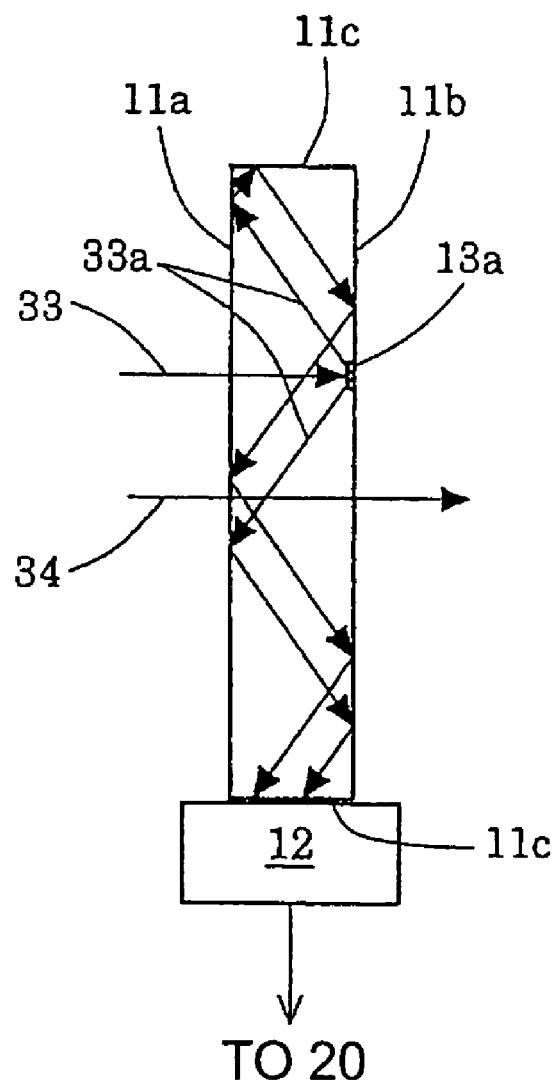
FIG. 4 is a schematic diagram depicting a configuration of a key section of a light detecting apparatus according to a first modification of the present embodiment.

In the case of the first modification shown in FIG. 4, a plurality of (only one is shown in FIG. 4) reflection type micro diffusion surface areas 13a are dispersed and positioned on the optical surface 11b at the light emitting side of the light splitting element 11. Therefore the light 33, which transmits through the optical surface 11a at the light entering side of the light splitting element 11 and enters the reflection type diffusion surface area 13a formed on the optical surface 11b at the light emitting side, are reflected and scattered, and guided to various directions, and a part of the light 33a enter the optical surface 11a at the light entering side at an incident angle greater than or equal to the total reflection angle.

The light 33a, which reflects and scatters on the reflection type diffusion surface area 13a and enters the optical surface 11a at the incident angle greater than or equal to the total reflection angle, substantially propagates inside the light splitting element 11 without optical loss while repeating reflection on the optical surface 11a at the light entering side, the side face 11c of the light emitting element 11 and the optical surface 11b at the light emitting side, and is guided out of a specific area of the side face 11c of the light splitting element 11, and reaches the photoelectric detector 12. The light 34, which transmits through the optical surface 11a at the light entering side of the light splitting element 11 and enters an area other than the reflection type diffusion surface area 13a, on the other hand, transmit through the light splitting element 11 and reach the mask M as the exposure light.

In the case of the above mentioned embodiment and the first modification, the transmission type or reflection type diffusion surface area (13, 13a) is used as the incident angle conversion section. However the intensity of light, which travels straight through the transmission type diffusion surface area 13, is relatively high, but the intensity of light which changes its traveling direction largely via the diffusion surface area 13 and enters the optical surface 11b at an incident angle greater than or equal to the total reflection angle, becomes relatively low, as known in the case of the Lambert surface. In other words, the loss of light is relatively high in the incident angle conversion section (13, 13a) which uses the diffusion surface.

Figure 5:
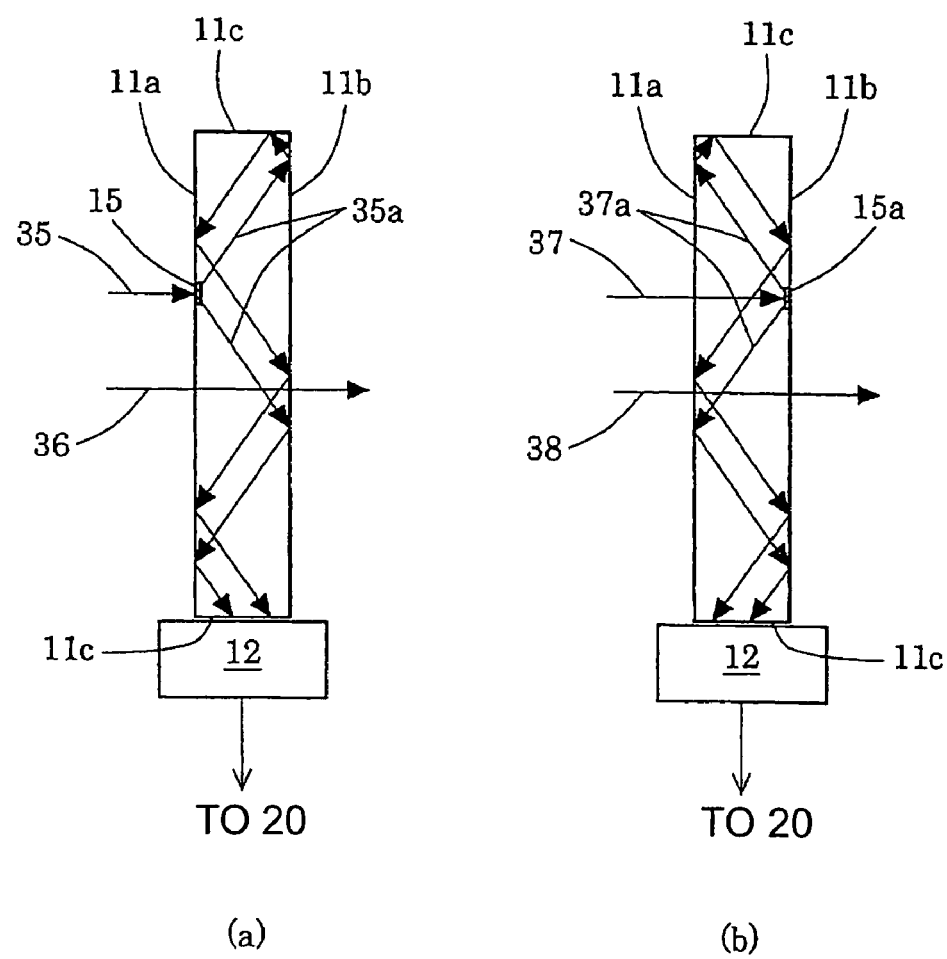
FIG. 5A is a schematic diagram depicting a configuration of a key section of a light detecting apparatus according to a second modification of the present embodiment.
FIG. 5B is a schematic diagram depicting a configuration of a key section of a light detecting apparatus according to a third modification of the present embodiment.

Therefore as a modification for suppressing the loss of light in the incident angle conversion section, the second modification, which uses a transmission type diffraction grating 15 instead of the transmission type diffusion surface area 13 as shown in FIG. 5A, is possible. In this case, a transmission type phase grating of which phase difference is 180 degrees (=λ/2), for example, can be used as the transmission type diffraction grating 15, then the generation of an unnecessary 0-order transmitted light can be substantially suppressed. In the second modification, the light 35, which enters the transmission type diffraction grating 15 of the light splitting element 11, is subject to the diffraction function and enters the optical surface 11b at the incident angle greater than or equal to the total reflection angle as the ± first-order transmitted light 35a.

The light 35a, which passes through the transmission type diffraction grating 15 and enters the optical surface 11b at an incident angle greater than or equal to the total reflection angle, substantially propagates inside the light splitting element 11 without optical loss while repeating reflection on the optical surface 11b, the side face 11c and the optical surface 11a, is guided out of a specific area of the side face 11c of the light splitting element 11, and reaches the photoelectric detector 12. The light 36, which enters an area other than the transmission type diffraction grating 15 of the light splitting element 11, on the other hand, transmits through the light splitting element 11, and reaches the mask M as the exposure light.

In the same way, the third modification shown in FIG. 5B, which uses a reflection type diffraction grating 15a instead of the reflection type diffusion surface area 13a, is possible. In this case, the generation of an unnecessary 0-order transmitted light can be substantially suppressed by using a reflection type phase grating of which phase difference is 180 degrees (=λ/2), for example, as the reflection type diffraction grating 15a. In the third modification, the light 37, which transmitted through the optical surface 11a at the light entering side of the light splitting element 11 and enters the reflection type diffraction grating 15a, is reflected and diffracted, and enters the optical surface 11a at an incident angle greater than or equal to the total reflection angle, as a ± first-order reflected light 37a, for example.

The light 37a, which is reflected and diffracted by the reflection type diffraction grating 15a and enters the optical surface 11a at an incident angle greater than or equal to the total reflection angle, substantially propagates inside the light splitting element 11 without optical loss, while repeating reflection on the optical surface 11a, the side face 11c and the optical surface 11b, is guided from a specific area of the side face 11c of the light splitting element 11, and reaches the photoelectric detector 12. The light 38, which transmits through the optical surface 11a at the light entering side of the light splitting element 11 and enters an area other then the reflection type diffraction grating 15a, on the other hand, transmits through the light splitting element 11, and reaches the mask M as the exposure light.

For the diffraction pattern of the transmission type diffraction grating and the reflection type diffraction grating, a one-dimensional diffraction grating, such as a one-dimensional diffraction grating which has a pitch in the longitudinal direction, a one-dimensional diffraction grating which has a pitch in the lateral direction in FIG. 3, or a one-dimensional diffraction grating, such as a one-dimensional diffraction grating which has a pitch in a 45 degree direction or 135 degree direction, for example, can be used. If such a one-dimensional diffraction grating is used, it is preferable to use a plurality of one-dimensional diffraction gratings having different pitch directions. A two-dimensional diffraction grating having a checkered patterned, for example, may also be used. The diffraction pattern is not limited to a diffraction grating, but may be a diffraction pattern with an arbitrary curve.

The diffraction pattern is not limited to the diffraction pattern formed with a phase pattern, as mentioned above, but may be an amplification pattern, such as a contrast pattern. If a apparatus for detecting light quality is used here, it is preferable to use a diffraction pattern of which diffraction efficiency has little dependency on polarization.

Figure 6:
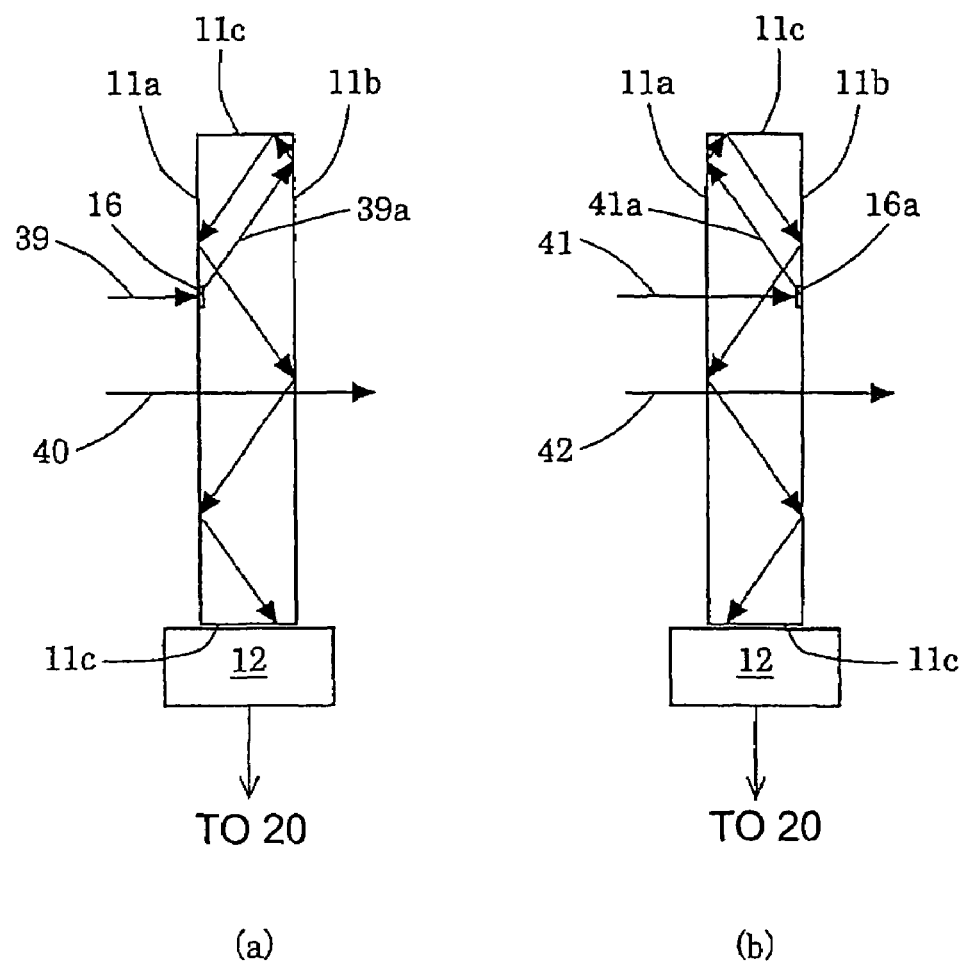
FIG. 6A is a schematic diagram depicting a configuration of a key section of a light detecting apparatus according to a fourth modification of the present embodiment.
FIG. 6B is a schematic diagram depicting a configuration of a key section of a light detecting apparatus according to a fifth modification of the present embodiment.

As a modification for suppressing the loss of light in the incident angle conversion section, the fourth modification, which uses a micro refraction surface 16, instead of the transmission type diffusion surface area 13, as shown in FIG. 6 (a), is possible. Here, unlike the above mentioned diffraction gratings (15, 15a), the micro refraction surface 16 is one or a plurality of (only one is shown in FIG. 6 (a)) micro refraction surfaces (micro prism or micro prism array) formed according to a module substantially larger than the wavelength λ of the light to be used. In the fourth modification, the light 39 enters the micro refraction surface 16 of the light splitting element 11 subject to the refraction function, becomes the light 39a, and enters the optical surface 11b at an incident angle greater than or equal to the total reflection angle.

The light 39a, which passes through the micro refraction surface 16 and enters the optical surface 11b at an incident angle greater than or equal to the total reflection angle, substantially propagates inside the light splitting element 11 without optical loss while repeating reflection on the optical surface 11b, the side face 11c and the optical surface 11a, is guided from a specific area of the side face 11c of the light splitting element 11, and reaches the photoelectric detector 12. The light 40, which enters an area other than the micro refraction surface 16 of the light splitting element 11, is transmitted through the light splitting element 11, and reaches the mask M as the exposure light.

In the same way, the fifth modification, which uses a micro reflection surface 16a instead of the reflection type diffusion surface area 13a, as shown in FIG. 6B, is possible. Here the micro reflection surface 16a is one or a plurality of (only one is shown in FIG. 6B) micro reflection surface(s) formed according to a module substantially larger than the wavelength λ of the light to be used. In the fifth modification, the light 41, which transmits through the optical surface 11a at the light entering side of the light splitting element 11 and enters the micro reflection surface 16a, is reflected, becomes the light 41a, and enters the optical surface 11a at an incident angle greater than or equal to the total reflection angle.

The light 41a, which is reflected by the micro reflection surface 16a and enters the optical surface 11a at the incident angle greater than or equal to the total reflection angle, substantially propagates inside the light splitting element 11 without optical loss, while repeating reflection on the optical surface 11a, the side face 11c and the optical surface 11b, is guided out of a specific area of the side face 11c of the light splitting element 11, and reaches the photoelectric detector 12. The light 42, which was transmitted through the optical surface 11a at the light entering side of the light splitting element 11 and enters an area other than the micro reflection surface 16a, transmits through the light splitting element 11, and reaches the mask M as the exposure light.

In the above mentioned embodiment and first modification to the fifth modification, the traveling direction of the light converted by the incident angle conversion section formed on one optical surface has an incident angle greater than or equal to the total reflection angle (critical angle) with respect to the other optical surface, but the reflection on the other optical surface need not be total reflection. For example, if the traveling direction of the light converted by the incident angle conversion section is within the total reflection angle (critical angle) with respect to the other optical surface, a thin film, which has a reflection prevention function (an anti-reflection function) for the light traveling the area other than the incident angle conversion section and has a reflection function for the light deflected via the incident angle conversion section, may be formed on the other optical surface. If the traveling direction of the light via the incident angle conversion section is within the total reflection angle (critical angle), but close to the total reflection angle with respect to the other optical surface, sufficient reflectance is expected, so the reflection film need not especially be formed on the other optical surface.

Figure 7:
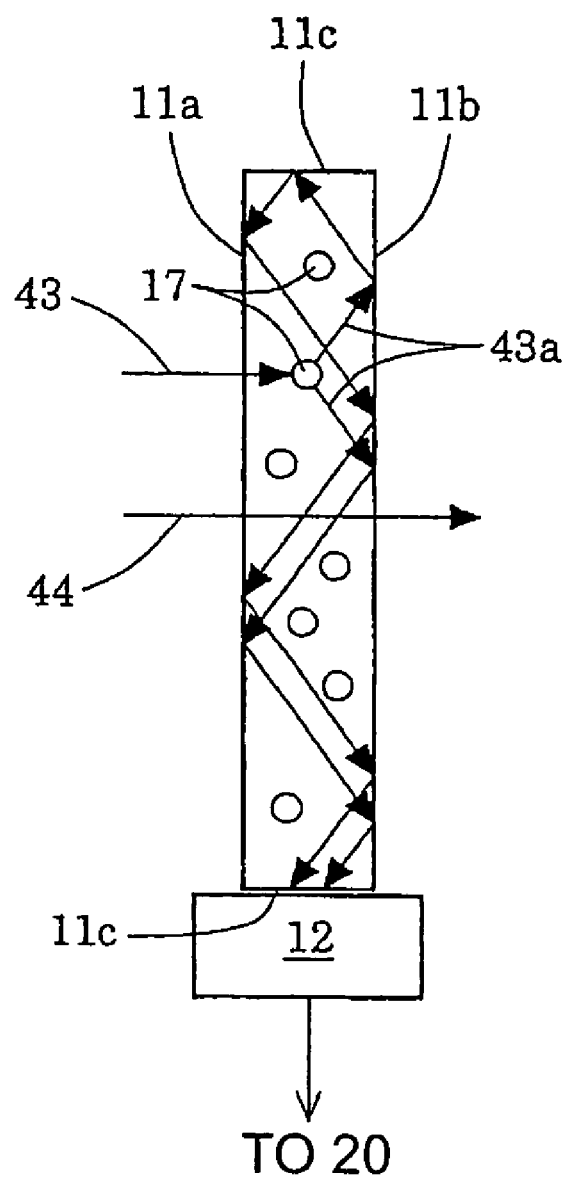
FIG. 7 is a schematic diagram depicting a configuration of a key section of a light detecting apparatus according to a sixth modification of the present embodiment.

Also in the above embodiment and the first modification to the fifth modification, the incident angle conversion section (13, 13a, 15, 15a, 16, 16a) formed on the optical surface (11a, 11b) of the light splitting element 11 is used. However, the present invention is not limited to this, and, as shown in FIG. 7, a modification using the incident angle conversion section, which is formed inside the light splitting element 11 and has scattering means 17 for scattering the incident light, is also possible.

Here the scattering means 17 is constructed as a kind of scattering structure (phase structure) by forming a plurality of (at least one theoretically) micro areas (e.g. micro bubbles), having a refractive index substantially different from the refractive index of the optical material constituting the light splitting element 11, dispersed inside the light splitting element 11. In the sixth modification shown in FIG. 7, the light 43, which transmits through the optical surface 11a at the light entering side of the light splitting element 11 and enters the scattering means 17, are subject to the scattering function and are guided to various directions, and a part of the light 43a enter the optical surface 11b at an incident angle greater than or equal to the total reflection angle.

The light 43a, which is scattered by the scattering means 17 and enters the optical surface 11b at an incident angle greater than or equal to the total reflection angle, substantially propagates inside the light splitting element 11 without optical loss while repeating reflection on the optical surface 11b, the side face 11c and the optical surface 11a, is guided from a specific area of the side face 11c of the light splitting element 11, and reaches the photoelectric detector 12. The light 44, which transmitted through the optical surface 11a at the light entering side of the light splitting element 11 and reached the optical surface 11b without entering the scattering means 17, transmits through the light splitting element 11, and reaches the mask M as the exposure light.

However, in the above embodiment and the first modification to the fifth modification, the light entered from the optical surface 11b at the light emitting side of the light splitting element 11 (e.g. reflected light from the mask M or plate P) substantially never enters the optical surface 11a at an incident angle greater than or equal to the total reflection angle, and therefore does not reach the photoelectric detector 12. Whereas in the sixth modification, the light entered from the optical surface 11b of the light splitting element 11 may pass through the scattering means 17 and enter the optical surface 11a at an incident angle greater than or equal to the total reflection angle, and reach the photoelectric detector 12, which may cause a detection error if the quantity of the reflected light from the mask M and plate P is relatively high.

Also in the above embodiment and the first modification to the sixth modification, the light which enters along a direction from the light source 1 to the mask M is detected in the optical path between the condenser optical system 8 and the mask M. However, the present invention is not limited to this, but as shown in FIG. 8, a modification, comprising a first light detecting device 10a for detecting light which enters along a direction from the light source 1 to the mask M in the optical path between the condenser optical system 8 and the mask M, and the second light detecting device 10b which is positioned closer to the mask side than the first light detecting device 10a and detects light which enters along a direction from the mask M to the light source 1, such as a reflected light from the mask M and plate P, is also possible.

Here, for the first light detecting device 10a, the light detecting device 10 according to the above embodiment or the first modification to the fifth modification can be used as original positioning. For the second light detecting device 10b, the light detecting device 10 according to the above embodiment or the first modification to the fifth modification, positioned in an opposite direction, so that the optical surface 11a of the light splitting element 11 faces the mask side and the optical surface 11b faces the light source side, can be used. In the example in FIG. 8, the light detecting apparatus of the second modification shown in FIG. 5(a) is used for the first light detecting device 10a and the second light detecting device 10b.

Figure 8:
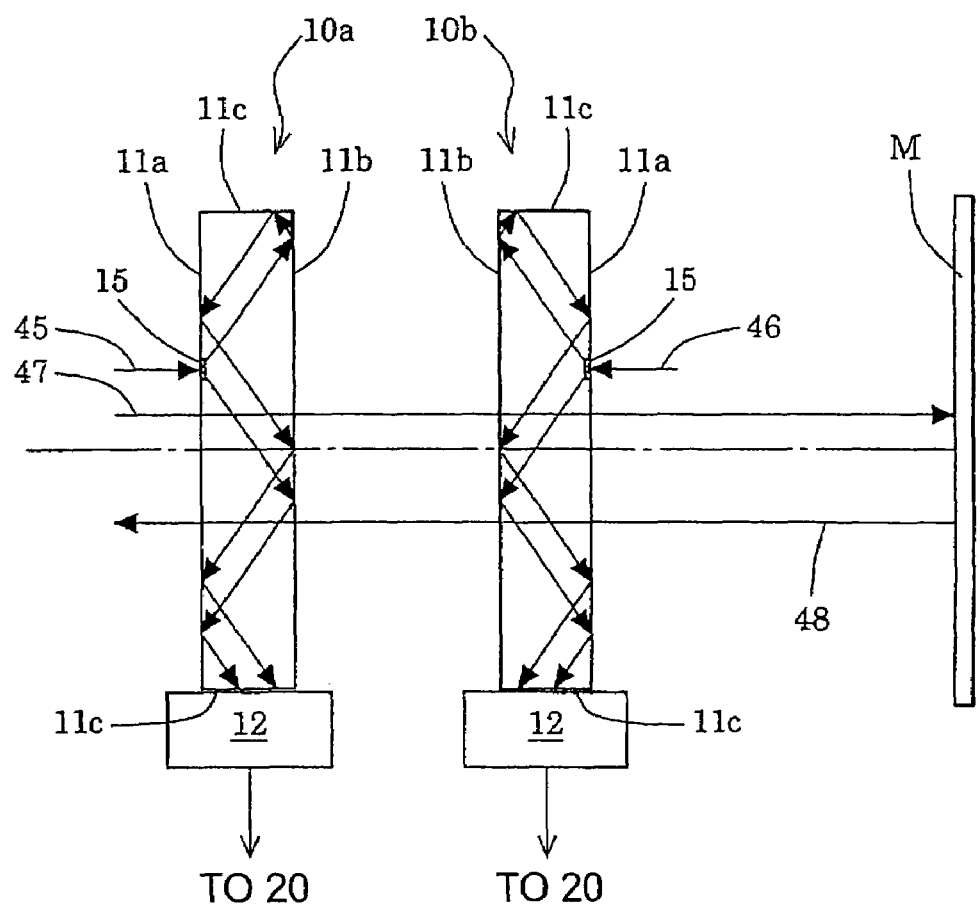
FIG. 8 is a schematic diagram depicting a configuration of a key section of a pair of light detecting devices according to a seventh modification of the present embodiment.

In the seventh modification shown in FIG. 8, out of the light which enters the optical surface 11a of the light splitting element 11 of the first light detecting device 10a in the direction from the light source 1 to the mask M, the light 45, which enters the transmission type diffraction grating 15, propagates inside the light splitting element 11, as mentioned above, and reaches the photoelectric detector 12. Whereas the light, which enters the transmission type diffraction grating 15 (not illustrated) out of the light which enters the optical surface 11b of the first light detecting device 10a in the direction from the mask M to the light source 1, transmits through the optical surface 11a while subject to the diffraction function, and therefore does not reach the photoelectric detector 12.

On the other hand, the light 46, which enters the transmission type diffraction grating 15, out of the light which enters the optical surface 11a of the light splitting element 11 of the second light detecting device 10b in the direction from the mask M to the light source 1, propagates inside the light splitting element 11 and reaches the photoelectric detector 12, as mentioned above. Whereas the light which enters the transmission type diffraction grating 15, out of the light which enters the optical surface 11b of the second light detecting device 10b in the direction of the light source 1 to the mask M (which is not illustrated), on the other hand, is transmitted through the optical surface 11a while subject to the diffraction function, and therefore does not reach the photoelectric detector 12. In the case of the light detecting apparatus of the sixth modification, on the other hand, the light which enters the optical surface 11b of the light splitting element 11 may also reach the photoelectric detector 12, so it is not desirable to apply the light detecting apparatus of the sixth modification to the seventh modification.

The light 47, which enters an area other than the transmission type diffraction grating 15, out of the light which enters the optical surface 11a of the light splitting element 11 of the first light detecting device 10a in the direction from the light source 1 to the mask M, transmits through the light splitting element 11 of the first light detecting device 10a and the light splitting element 11 of the second light detecting device 10b sequentially. In the same way, the light 48, which enters an area other than the transmission type diffraction grating 15, out of the light which enters the optical surface 11a of the light splitting element 11 of the second light detecting device 10b in the direction from the mask M to the light source 1, transmits through the light splitting element 11 of the second light detecting device 10b and the light splitting element 11 of the first light detecting device 10a sequentially.

Therefore in the seventh modification, the first light detecting device 10a, as the incident light monitor, detects light which enters along the direction from the light source 1 to the mask M, that is, the original incident light in the illumination optical path of the illumination optical apparatus (1 to 8), but does not detect light which enters along the direction from the mask M to the light source 1. On the other hand, the second light detecting device 10b as the reflected light monitor detects the light which enters along the direction from the mask M to the light source 1, such as a reflected light from the mask M and plate P, but does not detect light which enters along the direction from the light source 1 to the mask M.

In this way, the seventh modification, which has the first light detecting device 10a as the incident light monitor and the second light detecting device 10b as the reflected light monitor, can independently detect the light which enters along the direction from the light source 1 to the mask M, and the light which enters along the direction from the mask M to the light source 1. In other words, according to the seventh modification, the reflectance of the plate P can be measured based on the output of the first light detecting device 10a as the incident light monitor, and the output of the second light detecting device 10b as the reflected light monitor. As a result, as disclosed in Japanese Patent Application Laid-Open No. H8-236429, for example, the magnification of the projection optical system PL is fine-adjusted according to the change of the reflectance of the photosensitive substrate (plate P in the case of the present embodiment) to be exposed, and high precision exposure can be performed.

Figure 9:
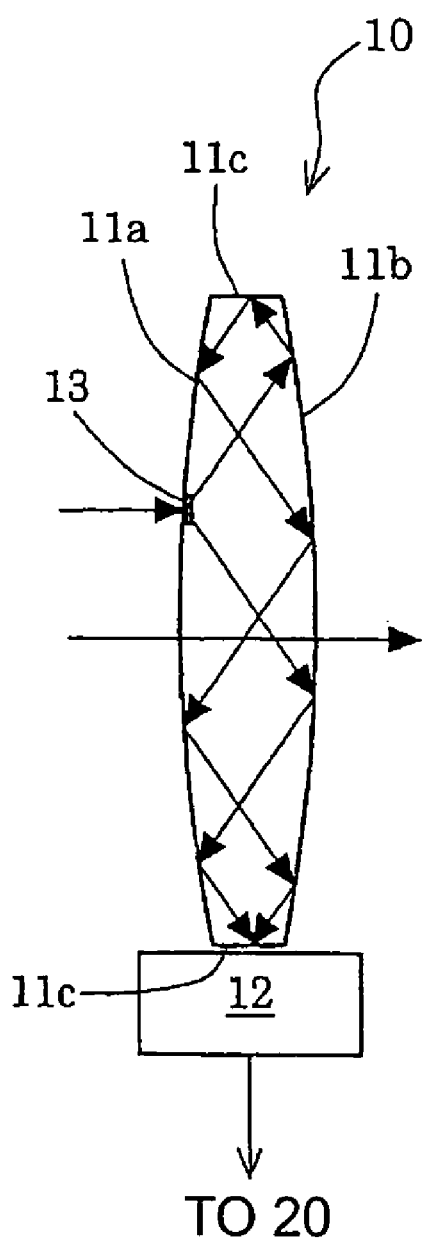
FIG. 9 is a schematic diagram depicting an eighth modification which uses a lens form light splitting element.

Also in the present embodiment and the first modification to the seventh modification, the light splitting element having the form of a plane parallel plate is used. However, the present invention is not limited to this, but an eighth modification which uses a light splitting element, which is generally placed in an optical path and has two optical surfaces, such as the lens type light splitting element shown in FIG. 9, is also possible. In FIG. 9, an example, when the transmission type diffusion surface are (incident angle conversion section) 13 according to the embodiment shown in FIG. 2B, is applied to the lens type light splitting element, is shown, but the incident angle conversion sections (13a, 15, 15a, 16, 16a) according to the first modification to the sixth modification, can also be applied in the same way.

Figure 10:
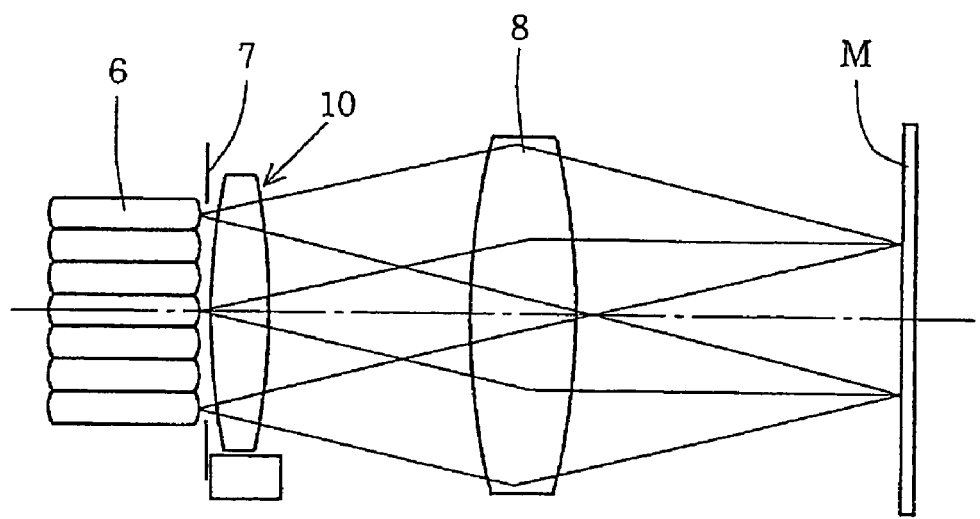
FIG. 10 is a schematic diagram depicting an example when the light detecting apparatus is arranged between the fly's eye lens and the condenser optical system.

Also in the above embodiment and the first modification to the eighth modification, the light detecting apparatus is positioned in the optical path between the condenser optical system 8 and the mask M, but the present invention is not limited to this, but the light detecting apparatus can be positioned in another appropriate optical path. Specifically, as FIG. 10 shows, the light detecting device 10 (10a, 10b), according to the above embodiment or the first modification to the eighth modification, can be positioned in the optical path between the fly's eye lens 6 and the condenser optical system 8. In this case, it is preferable to position the light detecting device 10 near the fly's eye lens 6, that is, near the position where the secondary light source is formed.

Figure 11:
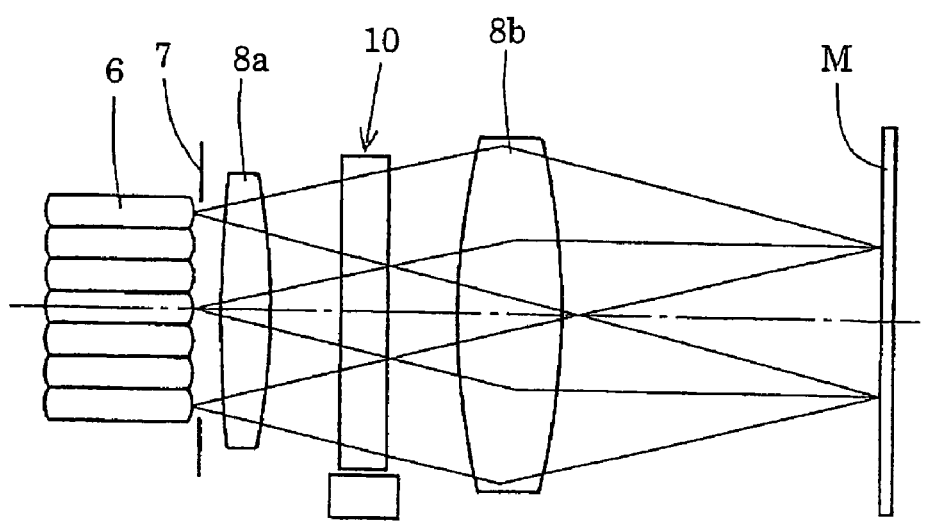
FIG. 11 is a schematic diagram depicting an example when the light detecting arranged in the optical path of the condenser optical system.

Also as FIG. 11 shows, the light detecting device 10, according to the above embodiment or the first modification to the eighth modification, may be positioned in the optical path of the condenser optical system 8, that is, in the optical path between the front group 8a and the rear group 8b. Also in FIG. 8, the first light detecting device 10a and the second light detecting device 10b are positioned next to each other, but another optical element may be positioned between the first light detecting device 10a and the second light detecting device 10b.

Figure 12:
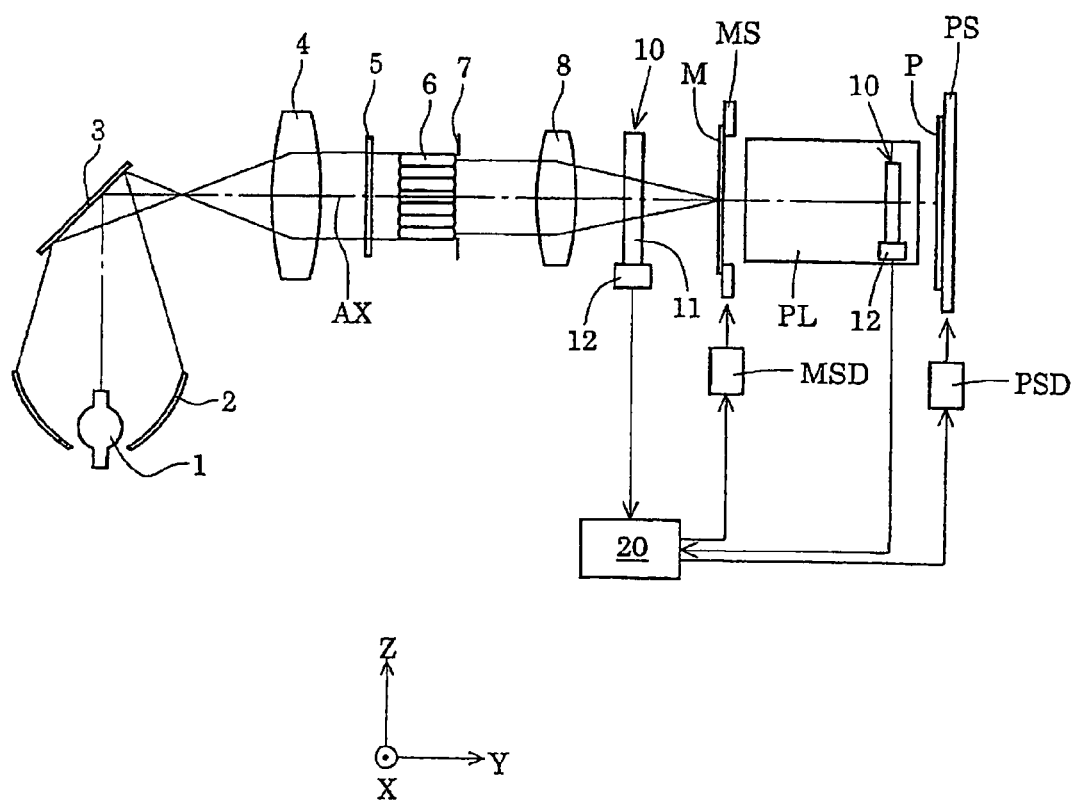
FIG. 12 is a diagram depicting an example when the light detecting apparatus according to the above mentioned embodiment or the first modification to the eighth modification is positioned in the projection optical system.

Also in the above embodiment and the first modification to the eighth modification, the light detecting apparatus is positioned in the optical path of the illumination optical apparatus, but the present invention is not limited to this, but the light detecting device 10, according to the above embodiment and the first modification to the eighth modification, may be positioned in the projection optical system PL, as shown in FIG. 12. Here, if the light detecting device 10 is positioned at the image surface side of the projection optical system PL, the quantity of light which reaches the image surface (plate P) of the projection optical system PL can be accurately detected even if a transmittance change occurs to the projection optical system PL. And if the light detecting device 10 is also installed in the optical path of the illumination optical system in addition to the above configuration, and the output ratio of these light detecting apparatus 10 is acquired, the transmittance change of the projection optical system PL can be monitored.

Also in the above embodiment and the first modification to the eighth modification, the form of a section corresponding to the photoelectric detector on the side face of the light splitting element is a part of a cylindrical surface, but this form may be a flat surface so that the photoelectric detector can be easily installed.

If the section corresponding to the photoelectric detector on the side face of the light splitting element is cylindrical, a light transmitting element having a concave cylindrical surface and flat surface may be placed between this section and the photoelectric detector as an optical coupling element. The form of the section corresponding to the photoelectric detector on the side face of the light splitting element may be a part of a troidal surface or toric surface, instead of a part of a cylindrical surface. In this case, a converging function for the light beam from the side face of the light splitting element can be improved compared to the case of the cylindrical surface.

For the incident angle conversion section, it is preferable that the light of which angle is converted has no substantial dependency on polarization (a phenomena in which light quantity and other characteristics change according to the polarization state of the light which passed through the incident angle conversion section). By this, even if a laser light source having a specific degree of polarization is used as the light source, or even if the polarization of the optical element in the optical path from the laser light source to the light detecting device 10 is changed, measurement errors due to this polarization change can be minimized.

In the above embodiment and each modification, if the illumination mode (e.g. cy value, light intensity distribution on the illumination pupil (circular, annular, multi-pole, etc.), polarization state) of the illumination optical apparatus can be changed, it is preferable to predetermine a calibration coefficient of the output of the light detecting device 10 in each illumination mode using an illumination meter placed at the position of the image surface (plate P) of the projection optical system PL. By calibrating the output of the light detecting device 10 for each illumination node using this calibration coefficient, accurate detection can be performed in any illumination mode. For an illumination optical apparatus which can switch the illumination mode, an illumination optical apparatus stated in International Patent Publication WO 2004/051717 Pamphlet is known.

In the above embodiment and each modification, light quantity is detected, but the present invention is not limited to this, and a polarization state, for example, may be detected. In this state, it is preferable that the incident angle conversion section has a desired polarization dependency. The incident angle conversion section may have a desired wavelength dependency, and in this case, the wavelength of the light or the wavelength distribution may be measured.

By electrically, mechanically or optically linking each optical element and each stage in the embodiment in FIG. 1, so as to implement the above mentioned functions, the exposure apparatus according to the present embodiment can be assembled. In the exposure apparatus shown in FIG. 1, a liquid crystal display apparatus, as a micro apparatus, can be acquired by forming a predetermined pattern (circuit pattern, electrode pattern, etc.) on the plate (glass substrate). Now an example of this method will be described with reference to the flow chart in FIG. 13.

Figure 13:
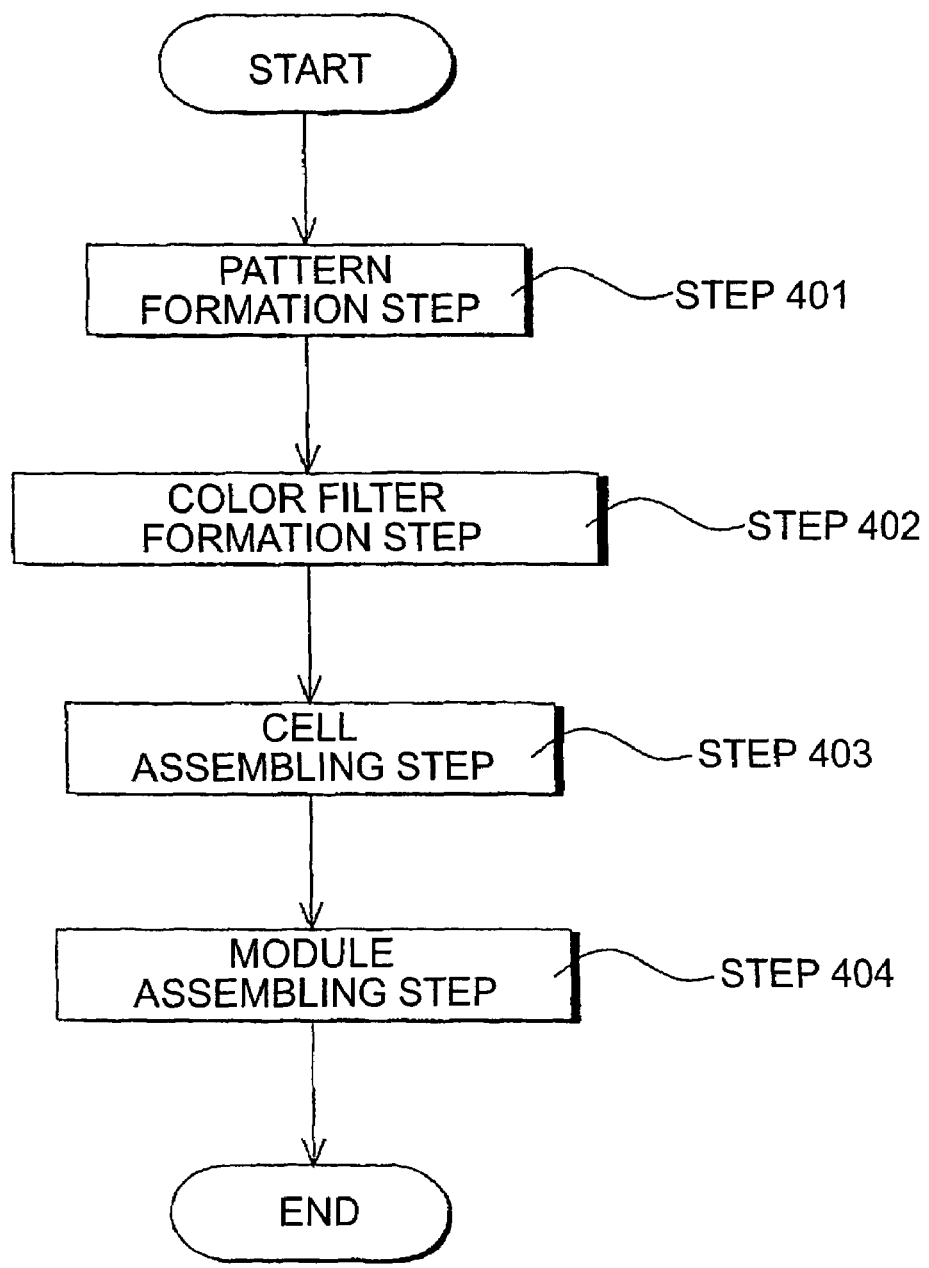
FIG. 13 is a flow chart depicting an example of a method to manufacture a liquid crystal display device as a micro device.

In FIG. 13, a photolithography step for transferring and exposing a pattern of a mask (reticle) onto a photosensitive substrate (e.g. glass substrate on which resist is coated) using the exposure apparatus of the present embodiment is executed in the pattern formation step 401. By this photolithography step, a predetermined pattern including many electrodes is formed on the photosensitive substrate. Then the exposed substrate passes through each of development step, etching step and resist stripping step, and as a result, the predetermined pattern is formed on the substrate, and the substrate moves to the next color filter formation step 402.

In the color filter formation step 402, many of three types of dot sets, corresponding to R (Red), G (Green) and B (Blue) are arrayed in a matrix, and a color filter, in which a plurality of sets of filters in three stripes, R, G and B, arrayed in a horizontal scanning direction, are formed. And after the color filter formation step 402, the cell assembling step 403 is executed.

In the cell assembling step 403, a liquid crystal panel (liquid crystal cell) is assembled using the substrate having the predetermined pattern acquired in the pattern formation step 401 and the color filter acquired in the color filter formation step 402. In the cell assembling step 403, liquid crystals are injected between the substrate having the predetermined pattern acquired in the pattern formation step 401 and the color filter acquired in the color filter formation step 402, so as to manufacture the liquid crystal panel (liquid crystal cell).

Then in the module assembling step 404, each component, such as an electric circuit for performing the display operation of the assembled liquid crystal panel (liquid crystal cell) and a backlight, is installed so as to complete a liquid crystal display apparatus. According to this manufacturing method of the liquid crystal display apparatus, liquid crystal apparatus having an extremely fine micro circuit pattern can be produced with good throughput.

By forming a predetermined circuit pattern on a wafer as a photosensitive substrate using the exposure apparatus according to the embodiment shown in FIG. 1, a semiconductor apparatus as a micro apparatus can also be acquired. Now an example of the method for acquiring a semiconductor apparatus as a micro apparatus will be described with reference to the flow chart in FIG. 14.

Figure 14:
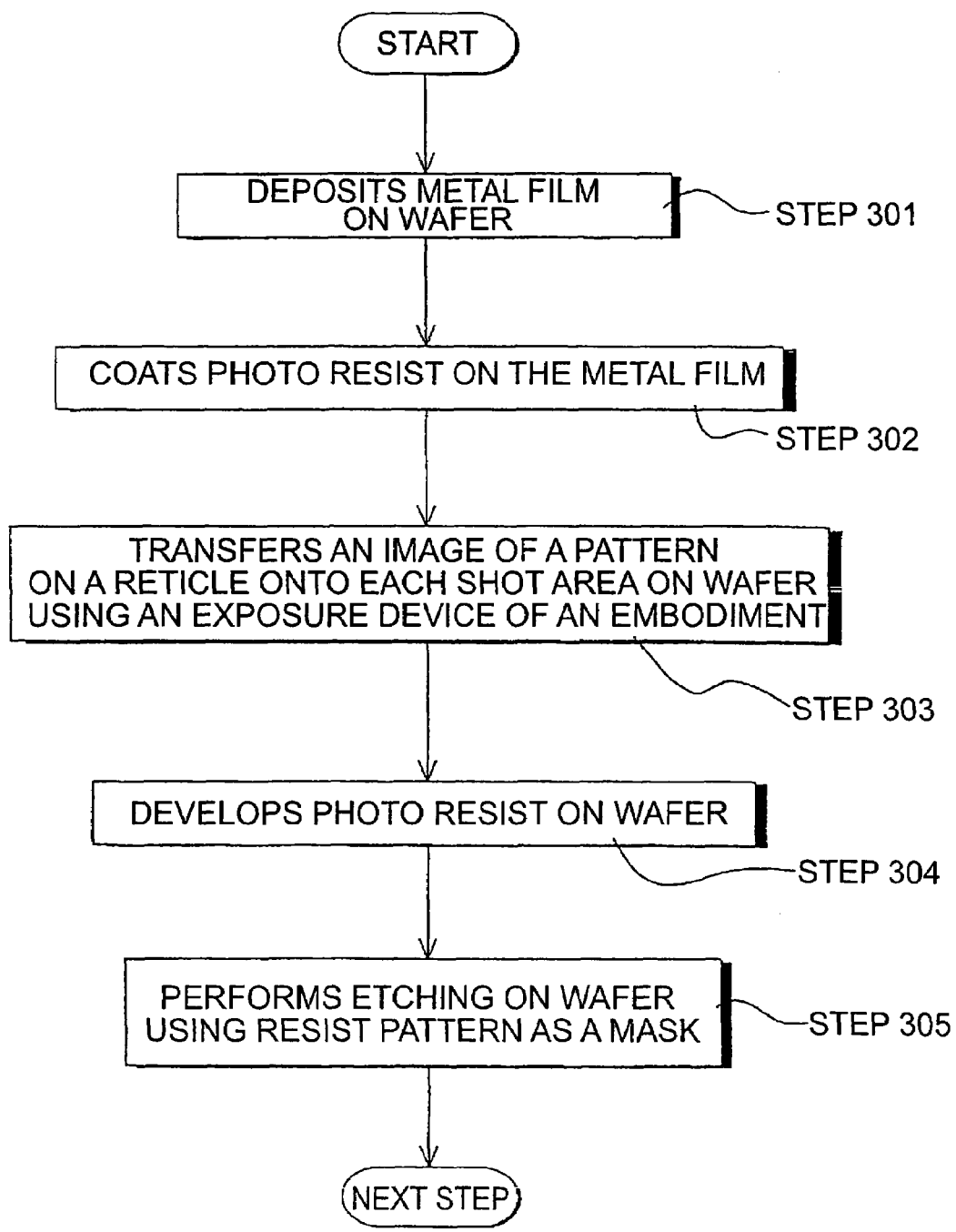
FIG. 14 is a flow chart depicting an example of the method to manufacture a semiconductor device as a micro device.
Figure 15:
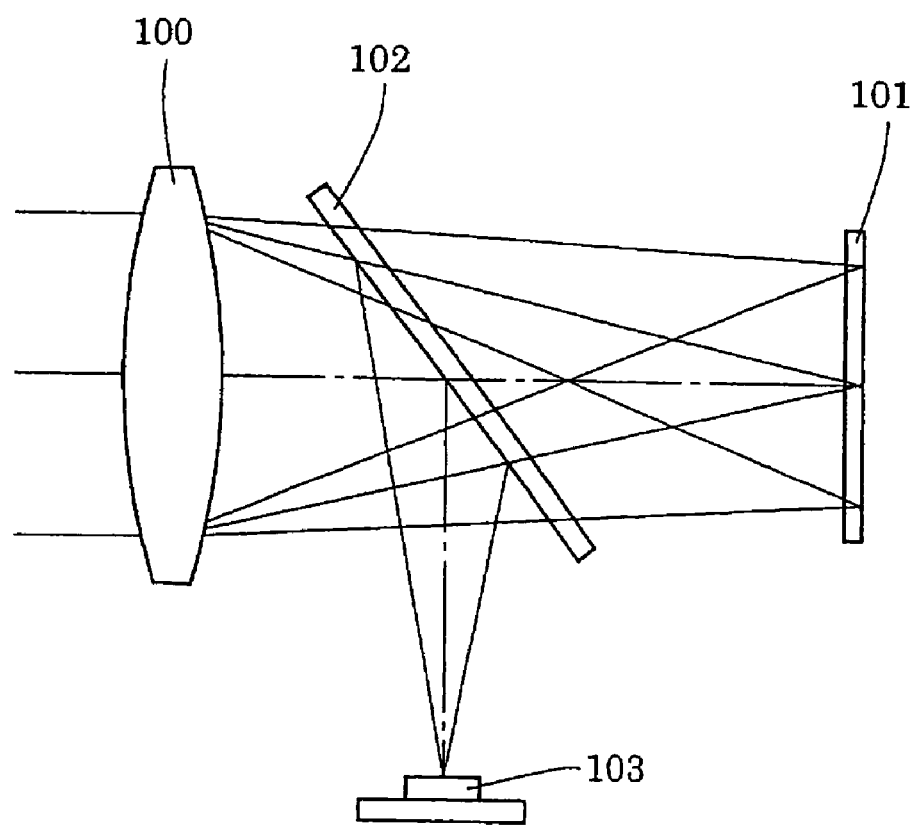
FIG. 15 is a schematic diagram depicting a configuration of a conventional light detecting apparatus.
Figure 16:
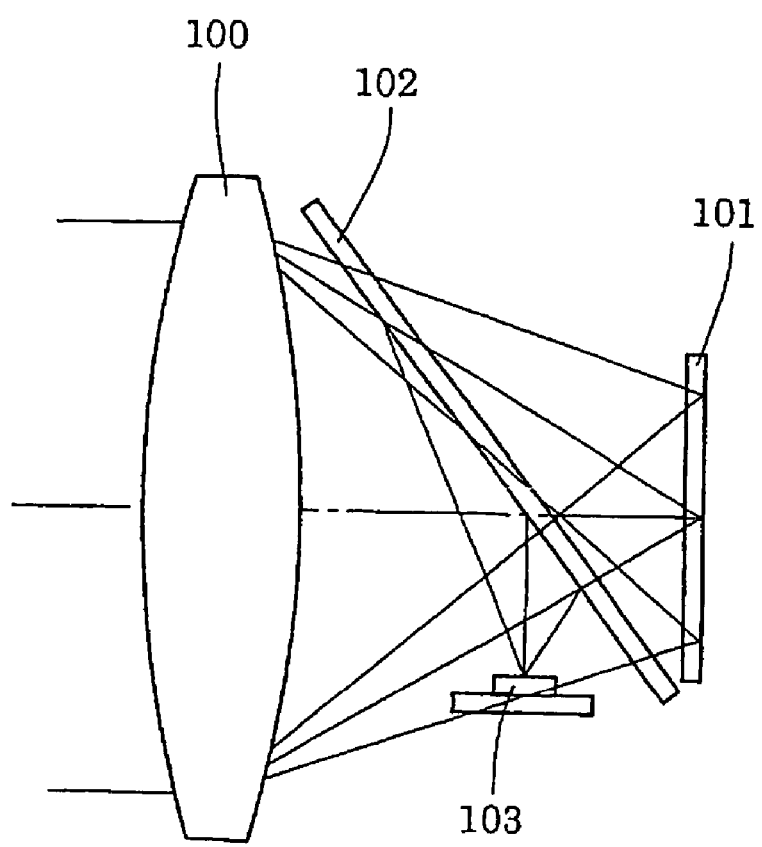
FIG. 16 is a diagram depicting a problem of the conventional light detecting apparatus.

First a metal film is deposited on a wafer of a lot in step 301 in FIG. 14. Then in step 302, photo resist is coated on the metal film of the wafer of a lot. Then in step 303, an image of a pattern on a mask (reticle) is sequentially exposed and transferred to each shot area of the wafer of a lot via the projection optical system PL, using the exposure apparatus shown in FIG. 1.

Then in step 304, the photo resist of the wafer of a lot was developed, and then in step 305, etching is performed using the resist pattern of the wafer of the lot as a mask, so as to form the circuit pattern corresponding to the pattern on the mask on each shot area of each wafer. Then the circuit patterns on the upper layers are formed, and the apparatus, such as a semiconductor apparatus, is completed. According to the above mentioned semiconductor apparatus manufacturing method, a semiconductor apparatus having extremely fine micro circuit patterns can be acquired with good throughput.

In the above embodiment, an example of using a light of a g line light, a light of an h line, and a light of an i line as exposure light was shown, but using a high pressure mercury lamp as the light source, for example, only a g line, only an h line, g line and h line, or h line and i line, may be used as the exposure light. For the light source, an KrF excimer laser which supplies 248 nm light, an ArF excimer laser which supplies 193 nm light or $F_2$ laser which supplies 157 nm light may be used as a light source.

In the above embodiment, the present invention is applied to an exposure apparatus which scans and exposes a mask pattern on each exposure area of a photosensitive substrate while relatively moving the mask and photosensitive substrate with respect to the projection optical system. However, the present invention is not limited to this, and can also be applied to an exposure apparatus which batch-exposes a mask pattern for each exposure of the photosensitive substrate.

Explanation of Reference Symbols
1 Light source
2 Elliptical mirror
4 Collimator lens
5 Wavelength selection filter
6 Fly's eye lens
7 Aperture stop
8 Condenser optical system
10 Light detecting apparatus
11 Light splitting element
12 Photoelectric detector
13 Transmission type diffusion surface area
13a Reflection type diffusion surface area
14 Contact element
15 Transmission type diffraction grating
15a Reflection type diffraction grating
16 Micro refraction surface
16a Micro reflection surface
17 Scattering means
20 Control section
M Mask
MS Mask Stage
PL Projection optical system
P Plate
PS Plate Stage

The invention claimed is:

1. An illumination optical apparatus for illuminating an illumination target surface with light beam from a light source, comprising a light detecting apparatus, arranged in an illumination path, which detects light which enters along a direction from the light source to the illumination target surface, the light detecting apparatus comprising:
a light splitting element including two optical surfaces positioned in the optical path; and
a photoelectric detector,
wherein the light splitting element further comprises an incident angle conversion section, arranged in the illumination path, which converts a part of light which enters one optical surface out of the two optical surfaces into light entering the other optical surface at an incident angle greater than or equal to a total reflection angle, and
wherein the photoelectric detector photo-detects light which propagates inside the light splitting element and is guided from a side face of the light splitting element.

2. The illumination optical apparatus according to claim 1, wherein the incident angle conversion section includes a transmission type diffusion surface formed on the one optical surface of the light splitting element, and
a part of light which enters the light splitting element along the predetermined direction transmits through the transmission type diffusion surface formed on the one optical surface, and is reflected on the other optical surface.

3. The illumination optical apparatus according to claim 2, wherein the reflection on the other optical surface is total reflection.

4. The illumination optical apparatus according to claim 1, wherein the incident angle conversion section includes a reflection type diffusion surface formed on the one optical surface of the light splitting element, and
a part of light which enters the light splitting element along the predetermined direction transmits through the other optical surface, reflected and scattered on the reflection type diffusion surface formed on the one optical surface, and is reflected on the other optical surface.

5. The illumination optical apparatus according to claim 4, wherein the reflection on the other optical surface is total reflection.

6. The illumination optical apparatus according to claim 1, wherein the incident angle conversion section includes a transmission type diffraction area formed on the one optical surface of the light splitting element, and
a part of light which enters the light splitting element along the predetermined direction passes through the transmission type diffraction area formed on the one optical surface, then is reflected on the other optical surface.

7. The illumination optical apparatus according to claim 6, wherein the reflection on the other optical surface is total reflection.

8. The illumination optical apparatus according to claim 1, wherein the incident angle conversion section includes a reflection type diffraction area formed on the one optical surface of the light splitting element, and
a part of light, which enters the light splitting element along the predetermined direction and transmits through the other optical surface, is reflected and diffracted in the reflection type diffraction area formed on the one optical surface, and is reflected on the other optical surface.

9. The illumination optical apparatus according to claim 8, wherein the reflection on the other optical surface is total reflection.

10. The illumination optical apparatus according to claim 1, wherein the incident angle conversion section includes a micro refraction surface formed on the one optical surface of the light splitting element, and
a part of light which enters the light splitting element along the predetermined direction passes through the micro refraction surface formed on the one optical surface, and then is reflected on the other optical surface.

11. The illumination optical apparatus according to claim 10, wherein the reflection on the other optical surface is total reflection.

12. The illumination optical apparatus according to claim 10, wherein the micro refraction surface is formed not to be parallel with the one optical surface of the light splitting element.

13. The illumination optical apparatus according to claim 1, wherein the incident angle conversion section includes a micro reflection surface formed on the one optical surface of the light splitting element, and
a part of light which enters the light splitting element along the predetermined direction transmits through the other optical surface, is reflected on the micro reflection surface formed on the one optical surface, and is reflected on the other optical surface.

14. The illumination optical apparatus according to claim 13, wherein the micro reflection surface is formed not to be parallel with the one optical surface of the light splitting element.

15. The illumination optical apparatus according to claim 13, wherein the reflection on the other optical surface is total reflection.

16. The illumination optical apparatus according to claim 1, further comprising:
a light intensity distribution change element positioned in the optical path of the illumination optical apparatus for changing light intensity distribution on a pupil surface of the illumination optical apparatus; and
an output correction section connected to the photoelectric detector of the light detecting apparatus for correcting output of the photoelectric detector according to the change of the light intensity distribution.

17. The illumination optical apparatus according to claim 1, further comprising a second light detecting apparatus positioned so as to detect light which enters in a direction from the illumination target surface to the light source, the second light detecting apparatus comprising:
a light splitting element including two optical surfaces positioned in the optical path; and
a photoelectric detector,
wherein the light splitting element further comprises an incident angle conversion section, arranged in the illumination path, which converts a part of light which enters one optical surface out of the two optical surfaces into light entering the other optical surface at an incident angle greater than or equal to a total reflection angle, and
wherein the photoelectric detector of the second light detecting apparatus photo-detects light which propagates inside the light splitting element and is guided from a side face of the light splitting element.

18. The illumination optical apparatus according to claim 1, further comprising an optical integrator, arranged in the illumination path, which forms a secondary light source based on the light beam from the light source, wherein the light detecting apparatus is positioned in an optical path between the optical integrator and the illumination target surface.

19. An exposure apparatus comprising the illumination optical apparatus according to claim 1 which illuminates a predetermined pattern, wherein the predetermined pattern is exposed on a photo sensitive substrate.

20. An exposure method, wherein a predetermined pattern is illuminated using the illumination optical apparatus according to claim 1, and the predetermined pattern is exposed on a photosensitive substrate.

21. An illumination optical apparatus for illuminating an illumination target surface with light beam from a light source, comprising a light detecting apparatus, arranged in an illumination path, which detects light which enters along a direction from the light source to the illumination target surface,
the light detecting apparatus comprising:
a light splitting element including two optical surfaces, positioned in the optical path and side faces;
a photoelectric detector positioned so as to face the side face of the light splitting element; and
an incident angle conversion section, provided on the light splitting element or in the light splitting element, which converts a part of light which enters one optical surface out of the two optical surfaces into light entering the other optical surface at an incident angle greater than or equal to a predetermined reflection angle.

22. The illumination optical apparatus according to claim 21, wherein the predetermined reflection angle is a critical angle with respect to the other optical surface.

23. The illumination optical apparatus according to claim 22, wherein the incident angle conversion section includes scattering part formed inside the light splitting element for scattering incident light.

24. The illumination optical apparatus according to claim 23, wherein the scattering part includes a micro area including a refractive index which is substantially different from a refractive index of an optical material constituting the light splitting element.

25. The illumination optical apparatus according to claim 21, wherein light reflection treatment is performed on the side face of the light splitting element excluding a transmission area of light guided from the light splitting element to the photoelectric detector.

26. The illumination optical apparatus according to claim 25, wherein the light reflection treatment is forming the side face of the light splitting element to be substantially smooth.

27. The illumination optical apparatus according to claim 25, wherein the light reflection treatment is forming a reflection film on the side face of the light splitting element.

28. The illumination optical apparatus according to claim 25, further comprising a contact element including a contact face which substantially contacts the side face of the light splitting element, excluding a transmission area of light guided from the light splitting element to the photoelectric detector, wherein light reflection treatment is performed on the contact face of the contact element.

29. The illumination optical apparatus according to claim 28, wherein the light reflection treatment is forming the contact face of the contact element to be substantially smooth.

30. The illumination optical apparatus according to claim 28, wherein the light reflection treatment is forming a reflection film on the contact face of the contact element.

31. The illumination optical apparatus according to claim 25, wherein a cross-sectional shape of the light splitting element is substantially a circle.

32. The illumination optical apparatus according to claim 21, wherein the side face of the light splitting element excluding the transmission area of light guided from the light splitting element to the photoelectric detector is substantially cylindrical.

33. The illumination optical apparatus according to claim 21, wherein the light splitting element includes substantially a parallel plane plate form.

34. The illumination optical apparatus according to claim 21, wherein the one optical surface and the other optical surface of the light splitting element are positioned substantially vertical to the incident light.

35. The illumination optical apparatus according to claim 21, further comprising:
a light intensity distribution change element positioned in the optical path of the illumination optical apparatus for changing light intensity distribution on a pupil surface of the illumination optical apparatus; and
an output correction section connected to the photoelectric detector of the light detecting apparatus for correcting output of the photoelectric detector according to the change of the light intensity distribution.

36. The illumination optical apparatus according to claim 21, further comprising a second light detecting apparatus positioned so as to detect light which enters in a direction from the illumination target surface to the light source, the second light detecting apparatus comprising:
a light splitting element including two optical surfaces positioned in the optical path; and
a photoelectric detector,
wherein the light splitting element further comprises an incident angle conversion section, arranged in the illumination path, which converts a part of light which enters one optical surface out of the two optical surfaces into light entering the other optical surface at an incident angle greater than or equal to a total reflection angle, and
wherein the photoelectric detector of the second light detecting apparatus photo-detects light which propagates inside the light splitting element and is guided from a side face of the light splitting element.

37. The illumination optical apparatus according to claim 21, further comprising an optical integrator, arranged in the illumination path, which forms a secondary light source based on the light beam from the light source, wherein the light detecting apparatus is positioned in an optical path between the optical integrator and the illumination target surface.

38. An exposure apparatus comprising the illumination optical apparatus according to claim 21 which illuminates a predetermined pattern, wherein the predetermined pattern is exposed on a photo sensitive substrate.

39. An exposure method, wherein a predetermined pattern is illuminated using the illumination optical apparatus according to claim 21, and the predetermined pattern is exposed on a photosensitive substrate.

40. A light splitting element positioned in an optical path for guiding a part of the entered light to outside the optical path, comprising:
two optical surfaces positioned in the optical path, and
an incident angle conversion section, arranged in the optical path, which converts a part of light which enters one optical surface out of the two optical surfaces into light entering the other optical surface at an incident angle greater than or equal to a critical angle,
wherein the side face of the light splitting element excluding the transmission area of light guided from the light splitting element to outside the optical path is substantially cylindrical.

41. An exposure apparatus for exposing a predetermined pattern on a photosensitive substrate via a projection optical system, comprising the light splitting element according to claim 40, wherein the light splitting element is positioned between the predetermined pattern and the photosensitive substrate.

42. An exposure method, wherein a predetermined pattern is illuminated using the exposure apparatus according to claim 41, and the predetermined pattern is exposed on a photosensitive substrate.

43. A light splitting element positioned in an optical path for guiding a part of entered light to outside the optical path, comprising:
two optical surfaces positioned in the optical path and a side face, and
an incident angle conversion section provided on the light splitting element or in the light splitting element which converts a part of light which enters one optical surface out of the two optical surfaces into light entering the other optical surface at an incident angle greater than or equal to a predetermined reflection angle,
wherein the side face of the light splitting element excluding the transmission area of light guided from the light splitting element to outside the optical path is substantially cylindrical.

44. The light splitting element according to claim 43, wherein the predetermined reflection angle is a critical angle with respect to the other optical surface.

45. The light splitting element according to claim 43, wherein a part of light which enters the one optical surface of the light splitting element is output from the side face.

46. The light splitting element according to claim 45, wherein the incident angle conversion section includes at least one of a diffusion surface, diffraction pattern, micro refraction surface and micro reflection surface formed on the one optical surface.

47. The light splitting element according to claim 45, wherein the incident angle conversion section includes scattering part formed inside the light splitting element for scattering incident light.

48. The light splitting element according to claim 45, wherein the light splitting element includes a substantially plane parallel plate form.

49. A light detecting apparatus for detecting light entering in a predetermined direction in an optical path, comprising:
the light splitting element according to claim 43; and
a photo electric detector arranged to face the side face of the light splitting element for photo detecting light guided from the light splitting element.

50. An exposure apparatus for exposing a predetermined pattern on a photosensitive substrate via a projection optical system, comprising the light splitting element according to claim 43, wherein the light splitting element is positioned between the predetermined pattern and the photosensitive substrate.

51. An exposure method, wherein a predetermined pattern is illuminated using the exposure apparatus according to claim 43, and the predetermined pattern is exposed on a photosensitive substrate.

* * * * *